United States Patent
Min et al.

Patent Number: 5,232,509
Date of Patent: Aug. 3, 1993

[54] APPARATUS FOR PRODUCING LOW RESISTIVITY TUNGSTEN THIN FILM COMPRISING REACTION TEMPERATURE MEASURING THERMOCOUPLES

[75] Inventors: Suk-Ki Min; Yong T. Kim, both of Seoul, Rep. of Korea

[73] Assignee: Korea Institute of Science and Technology, Seoul, Rep. of Korea

[21] Appl. No.: 910,061

[22] Filed: Jul. 8, 1992

[30] Foreign Application Priority Data

Jul. 9, 1991 [KR] Rep. of Korea ............... 11617/1991

[51] Int. Cl.⁵ ............................................. C23C 16/50
[52] U.S. Cl. .................................. 118/723; 118/725; 118/712
[58] Field of Search ............... 118/723, 666, 667, 688; 156/345; 174/36, 32, 19, 24

[56] References Cited

U.S. PATENT DOCUMENTS

| | | | |
|---|---|---|---|
| 4,115,184 | 9/1978 | Poulsen | 156/646 X |
| 4,336,277 | 6/1982 | Bunshah et al. | 427/592 X |
| 4,396,640 | 8/1983 | Rocheleau et al. | 118/666 X |
| 4,692,343 | 9/1987 | Price et al. | 427/574 |
| 4,714,625 | 12/1987 | Chopra et al. | 427/561 |
| 4,980,223 | 12/1990 | Nakano et al. | 174/36 X |

FOREIGN PATENT DOCUMENTS

| | | | |
|---|---|---|---|
| 01-68918 | 3/1989 | Japan | |
| 01-92384 | 4/1989 | Japan | 118/666 |
| 02-5518 | 1/1990 | Japan | 118/666 |
| 02-70067 | 3/1990 | Japan | 118/666 |
| 02-112254 | 4/1990 | Japan | |

OTHER PUBLICATIONS

Schmitz et al., "Wafer Temperature in Cold Wall CVD Reactions," Materials Research Society, 1989, pp. 211-217.
Tang et al., "Plasma-Enhanced Chemical Vapor Deposition of β-Tungsten, a Metastable Phase," Appl. Phys. Lett. 45(6), Sep. 15, 1984, pp. 633-635.
Mahowald et al., "Plasma-Enhanced Chemical Vapor Deposition of Tungsten", Thin Solid Films, 170 (1989), pp. 91-97.
Chu et al., "Plasma-enhanced Chemical Vapor Deposition of Tungsten Films", Appl. Phys. Lett. 41(1), Jul. 1, 1982, pp. 75-77.
Stacy et al., "Interfacial Structure of Tungsten Layers Formed by Selective Low Pressure Chemical Vapor Deposition", J. Electrochem. Soc.: Solid-State Science and Technology, vol. 132, No. 2, Feb. 1985, pp. 444-448.

Primary Examiner—Brian E. Hearn
Assistant Examiner—Jonathan D. Baskin
Attorney, Agent, or Firm—Lowe, Price, LeBlanc & Becker

[57] ABSTRACT

The present invention relates to an apparatus for producing low resistivity tungsten thin films by a plasma enhanced chemical vapor deposition (PECVD) system. The structure of the invented system comprises the conventional PECVD reactor in which diffuser/electrode and hot plate heated by the hot wire and an apparatus to measure the exact surface temperature of monitoring silicon wafers. In order to control the tungsten deposition temperature exactly, two thermocouples encapsulated within the isolation tube extended to common ground outside the reactor to eliminate rf noise, are inserted into the small cavities made on two monitoring wafers, which ar placed in the surface of hot plate. Using the above mentioned system, the present invention is effective to measure and control the exact surface temperature of the silicon substrate; one of the major factors to produce low resistivity tungsten thin films.

1 Claim, 2 Drawing Sheets

APPARATUS FOR PRODUCING LOW RESISTIVITY TUNGSTEN THIN FILM COMPRISING REACTION TEMPERATURE MEASURING THERMOCOUPLES

BACKGROUND OF THE INVENTION

The present invention relates to an apparatus for producing low resistivity tungsten thin films by plasma enhanced chemical vapor deposition (PECVD) technique and more particularly, to a temperature measuring system inside the PECVD reactor, which enables one to measure exact surface temperature of the silicon substrate; one of the major factors to produce low resistivity tungsten thin films.

At present, in general, deposition techniques of tungsten films are divided broadly into two main categories; physical vapor deposition (PVD) and chemical vapor deposition (CVD) techniques. The former technique, for instance, utilizes sputtering or electron beam melting of the high purity target and the latter utilizes the thermal decomposition of a $WF_6$-$H_2$ gas system at low pressure, which is the low pressure chemical vapor deposition (LPCVD) technique.

When the PVD technique is used to produce thin films of tungsten, the problems such as high probability of defect formation due to the radiation damage and poor step coverage arise. Moreover resistivity of the deposited tungsten thin films is higher than 50 micro-ohms-cm.

The use of the LPCVD technique can obtain high quality tungsten thin films free of the problems associated with PVD technique listed above, which is a distinguishing feature of the LPCVD technique. However the conventional LPCVD technique has a difficulty in the initiation of tungsten nucleation on substrates other than silicon such as insulator or compound semiconductor material. Therefore when the tungsten film is needed to be deposited on any substrate type, LPCVD techniques cannot meet the requirements. [Please refer to W. T. Stacy, E. K. Broadbent, M. H. Norcott, J. Electrochem. Soc., 132, 444 (1985)].

Plasma enhanced CVD (PECVD), one of the newly developed CVD techniques, allows one to deposit tungsten thin films onto any substrate and produce conformal step coverage better than that of LPCVD films, which is about 10 micro-ohms-cm, and it limits PECVD technique to be applied to the real device fabrication. [Please refer to C. C. Tang, D. W. Hess, Appl. Phys. Lett., 45,633 (1984)].

In order to produce high quality PECVD tungsten thin films with low resistivity, it is important to measure and control the deposition temperature accurately, since it is the major factor influencing the quality of the deposited films.

Since the surface temperature of the substrate depends on the parameters such as the temperature of the hot plate and total pressure in plasma ambience, the conventional PECVD system measures the temperature of the hot plate which is a certain distance apart from the substrate as in FIG. 1 instead of measuring temperature of the substrate directly. Consequently, the deposition temperature is not determined by the actual substrate temperature and can lead to quite erroneous results.

In order words, referring to FIG. 1, in the conventional PECVD system, where diffuser/electrode 2 is placed on the upper part of a reactor 1 and a hot plate 4 heated by a heating wire 3 on the lower part of the reactor 1, temperature of the hot plate 4 with the silicon wafer 5 Placed on the top is measured by the thermocouple T, so that there is a great difference between the actual surface temperature of the substrate and that of the hot plate 4.

Unlike the conventional PECVD system described above, there is a way to measure temperature of the wafer directly with the optical pyrometer, but the emissivity changes as the tungsten deposition progresses and also the plasma emission effects the reading of the pyrometer. In result, it is impossible to measure the exact temperature of the substrate. [Please refer to J. E. J. Schmitz, J. L. G. Suijker, M. J. Buiting, Tungsten and Other Refractory Metals for VLSI Applications IV, eds. R. S. Blewer and McConica, Materials Research Soc., Pittsburgh, 211 (1989)].

On the other hand, there is another way to measure the temperature of the substrate by placing the thermocouple directly on the substrate, but the high frequency electromagnetic wave (radio frequency; rf) from the plasma source causes noise and it hinders to obtain exact temperature.

SUMMARY OF THE INVENTION

It is, therefore, an object of the present invention to provide an apparatus for measuring plasma-enhanced chemical vapor deposition temperature which can measure and control the surface temperature of the substrate accurately.

In accordance with the present invention, a blank silicon wafer is utilized, which is identical to the actual silicon substrate. In the present invention, in particular, a thermocouple, isolated from radio frequency noise, is inserted into the small cavity provided in the blank wafer, and the wafer is placed on the same position as the substrate inside the reactor.

Especially, the thermocouple line, connected to the blank wafer, is encapsulated within a metal tube to eliminate any rf noise coming from the plasma source. As a result, it is made possible to take an accurate measurement and to control the surface temperature of the substrate, and the resistivity of the deposited tungsten thin films is lowered to 10 micro-ohms-cm.

BRIEF DESCRIPTION OF THE DRAWINGS

The above and other objects, features and advantages of the present invention will become apparent from the following detailed description taken in conjunction with the accompanying drawings, wherein: p

DETAILED DESCRIPTION OF THE INVENTION

Figure 1:
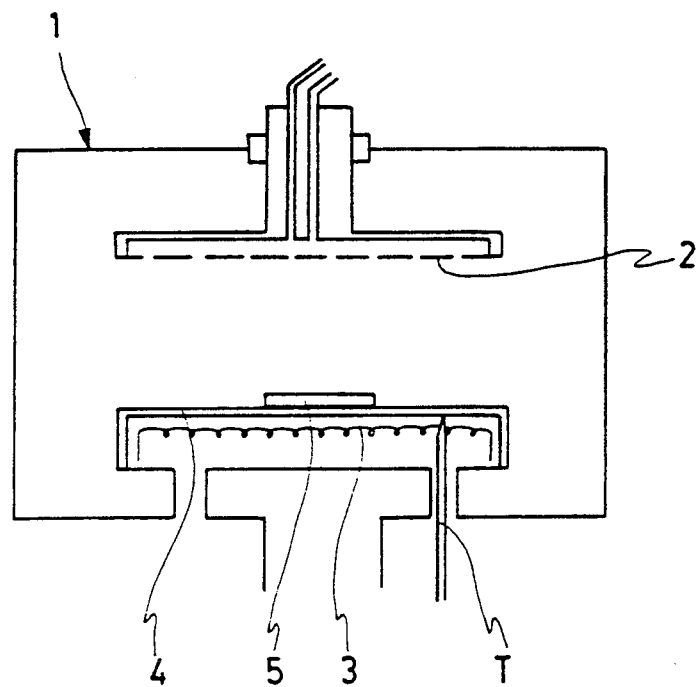
FIG. 1 is a schematic diagram illustrating the configuration of a conventional PECVD system.
Figure 2:
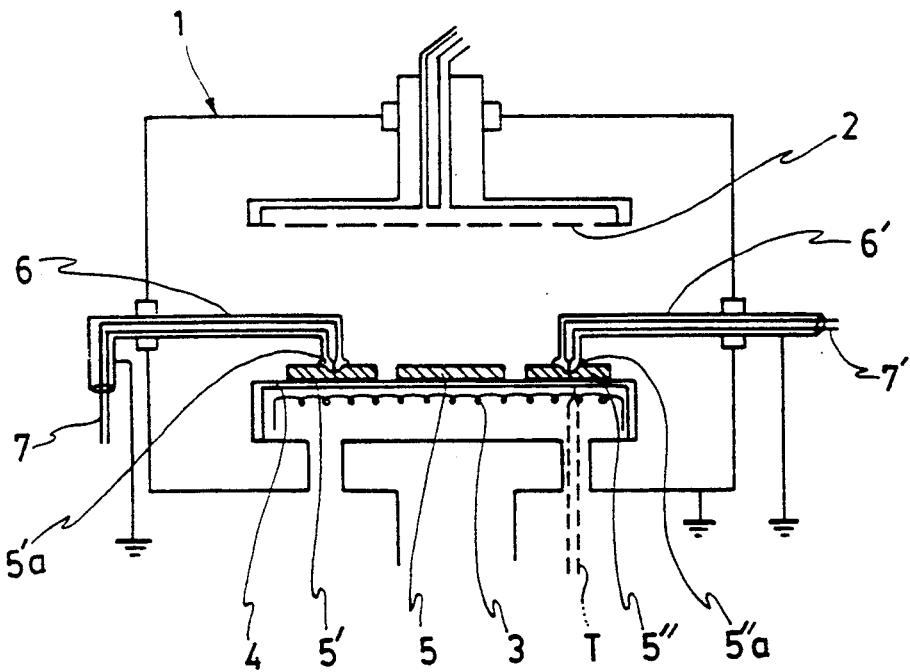
FIG. 2 is a schematic diagram illustrating the configuration of a temperature measuring apparatus according to the present invention.

Referring to FIG. 2, there is shown an example of the reactor structure in accordance with the present invention.

As shown in FIG. 2, the temperature measuring apparatus comprises a diffuser/electrode 2 and hot plate 4, heated by a heating wire 3, inside a cylindrical reactor 1 made of stainless steel the diffuser/electrode 2 and hot plate 4 are placed on the upper and lower part of the reactor 1. The reaction gases are introduced into the reactor 1 through the diffuser 2 and tungsten deposition occurs on the silicon substrate 5 placed on the hot plate 4. A pair of thermocouples 7 and 7', encapsulated within isolation tubes 6 and 6' to eliminate radio frequency noise, are inserted into small cavities of 0.5 mm diameter 5a' and 5a" made in two wafers 5' and 5", which are placed on the hot plate 4. The thermocouples 7 and 7' and inner wall of the cavities 5a' and 5a" are cemented together with a ceramic bond, and the isolation tubes 6 and 6' are extended to the common ground outside the reactor 1. The hot plate 4 of the reactor 1, lower electrode, and the reactor 1 are all connected commonly to the ground. The thermocouples 7 and 7' are connected to the temperature controller, not shown in the figure, and the digital voltmeter, not shown in the figure, separately to measure the surface temperature of the silicon substrate 5.

For the thermocouples 7 and 7', it is better to use k-type, and the isolation tubes 6 and 6' should be vacuum sealed enclosing the thermocouples 7 and 7'.

When the tungsten thin films are deposited on the silicon substrate using the system in accordance with the present invention, the measured temperature through the thermocouples is exactly the same as the surface temperature of the silicon substrate. Hence one can control the reactor to maintain the optimum temperature for the deposition of tungsten thin films with the resistivity as low as around 10 micro-ohms-cm.

Figure 3:
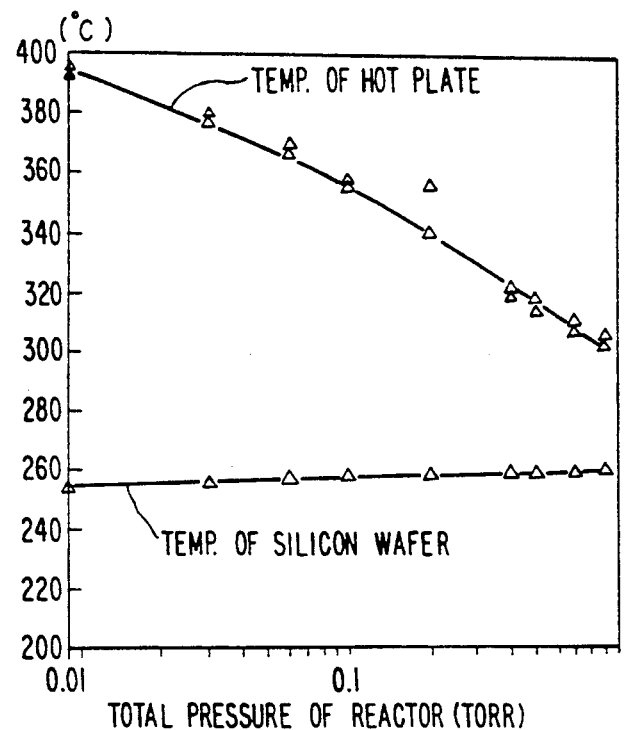
FIG. 3 is a graph illustrating the relationship between deposition pressure and deposition temperature.

The graph in FIG. 3 represents the difference between the measured values of the surface temperature of the silicon substrate in accordance with the present invention and that of the hot plate measured by the conventional method described above with the variation of the pressure; for the conventional temperature measurement, the thermocouple T enclosed in the dotted line in FIG. 2 is connected to the bottom side of the hot plate.

Judging from FIG. 3, one can find out that the temperature difference between the hot plate and the surface of the silicon substrate becomes larger as the total pressure of the reactor is lowered.

In other words, while the surface temperature of the substrate, where the actual deposition occurs, is kept at 257° C., the lower the reactor pressure, the higher the temperature of the hot plate becomes. Accordingly, if one uses the temperature of the hot plate to control the deposition, the actual temperature of the silicon surface will be much lower than the measured one. Not measuring the surface temperature of the substrate directly, the actual deposition temperature will be lowered by 70°–150° C., in result, it is impossible to produce low resistivity tungsten thin films, deviating largely from the optimum range of the deposition temperature.

Figure 4:
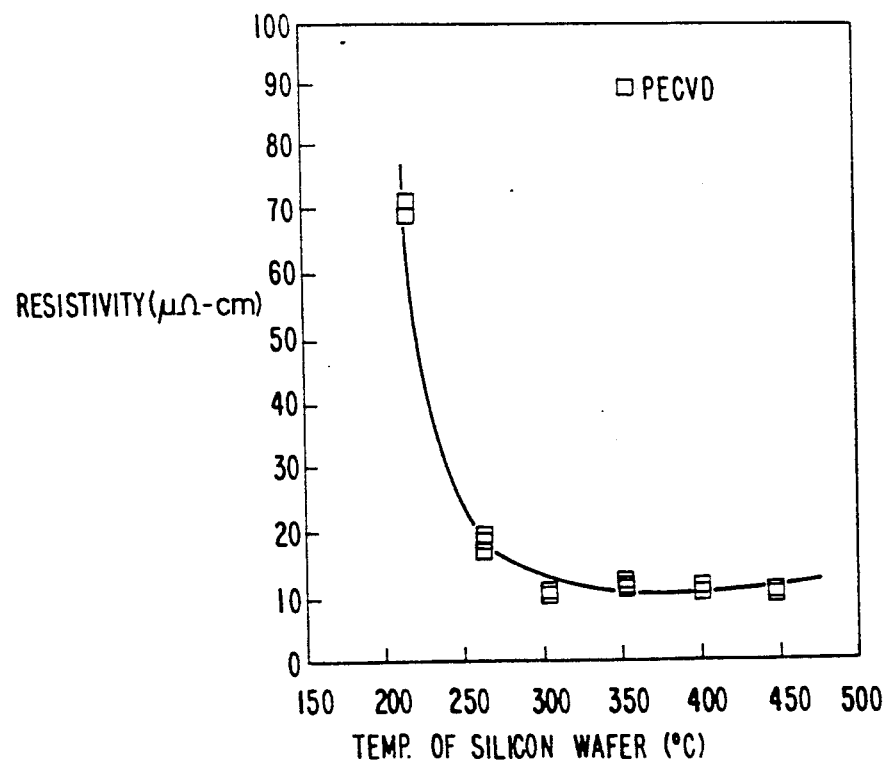
FIG. 4 is a graph illustrating the relationship between the temperature and the specific resistivity of a silicon substrate in the deposition process.

Next, referring to FIG. 4, when tungsten thin films are deposited, measuring and controlling the deposition temperature in accordance with the present invention, the graph shows the relationship between the changes in the deposition temperature and the resistivity of the films. It is found that the deposition temperature must be higher than 225° C. to produce the tungsten thin films with low resistivity.

However, in the case of measuring and controlling the deposition temperature based on the temperature of the hot plate as in the conventional PECVD system, at the deposition temperature of 350° C., the actual temperature of the substrate surface is maintained at 250° C. Consequently, the resistivity of the deposited thin films becomes high as in FIG. 4.

As mentioned above, the present invention measures the temperature of the blank wafer within the thermocouples, encapsulated with an isolation tube to eliminate radio frequency noise, all placed inside the reactor. Therefore it is made possible to measure the actual surface temperature of the substrate, and to produce tungsten thin films with low resistivity with ease.

What is claimed is:

1. An apparatus for producing low resistivity tungsten thin films by plasma enhanced chemical vapor deposition system, comprising:
   a reactor;
   a hot plate and a diffuser/electrode provided within said reactor and heated bey a heating wire;
   isolation tubes, extended to the ground outside the reactor, for eliminating rating radio frequency noise;
   silicon wafers having cavities in the surface thereof, placed on the hot plate together with a silicon substrate for tungsten deposition; and
   thermocouples encapsulated within said isolation tubes and inserted into cavities of the wafers.

* * * * *